(12) United States Patent
Van Ingen Schenau

(10) Patent No.: US 7,088,421 B2
(45) Date of Patent: Aug. 8, 2006

(54) LITHOGRAPHIC APPARATUS, DEVICE MANUFACTURING METHOD, AND DEVICE MANUFACTURED THEREBY

(75) Inventor: Koen Van Ingen Schenau, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 333 days.

(21) Appl. No.: 10/648,796

(22) Filed: Aug. 27, 2003

(65) Prior Publication Data

US 2004/0105081 A1  Jun. 3, 2004

(30) Foreign Application Priority Data

Aug. 30, 2002  (EP)  .................................. 02256036

(51) Int. Cl.
  *G03B 27/52*  (2006.01)
  *G03B 27/42*  (2006.01)
(52) U.S. Cl. .......................................... 355/30; 355/53
(58) Field of Classification Search .................. 355/30, 355/53, 71; 438/325, 739
See application file for complete search history.

(56) References Cited

U.S. PATENT DOCUMENTS

| 5,390,785 | A | 2/1995 | Garric et al. ............. 206/213.1 |
| 5,547,328 | A | 8/1996 | Bonora et al. ........... 414/217.1 |
| 5,607,647 | A | 3/1997 | Kinkead |
| 5,871,587 | A | 2/1999 | Hasegawa et al. .......... 118/719 |
| 6,133,981 | A | 10/2000 | Semba ........................ 355/27 |
| 6,826,451 | B1 * | 11/2004 | del Puerto et al. .......... 700/245 |
| 2002/0020344 | A1 * | 2/2002 | Takano ....................... 118/100 |
| 2003/0038929 | A1 | 2/2003 | Tokuda et al. ................ 355/30 |
| 2003/0045098 | A1 * | 3/2003 | Verhaverbeke et al. ..... 438/689 |

FOREIGN PATENT DOCUMENTS

| EP | 0 856 872 A2 | 8/1998 |
| EP | 0 856 872 A3 | 12/2000 |

* cited by examiner

*Primary Examiner*—W. B. Perkey
*Assistant Examiner*—Vivian Nelson
(74) *Attorney, Agent, or Firm*—Pillsbury Winthrop Shaw Pittman, LLP

(57) ABSTRACT

A transport unit transfers a substrate between a chamber enclosing a substrate table and a processing unit that process a substrate before and after exposure in a substantially contaminant free environment to minimize the exposure of the resist on the substrate to the contaminants.

25 Claims, 1 Drawing Sheet

LITHOGRAPHIC APPARATUS, DEVICE MANUFACTURING METHOD, AND DEVICE MANUFACTURED THEREBY

CROSS REFERENCE TO RELATED APPLICATION

This application claims priority to European Application 02256036.1, filed Aug. 20, 2002, the entire contents of which are incorporated herein by reference.

BACKGROUND OF THE INVENTION

1. Field of the Invention

The present invention relates to a lithographic projection apparatus, a device manufacturing method and a device manufactured thereby.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from U.S. Pat. No, 5,296,891 and 5,523,193, and WO 98/38597 and WO 98/33096. In the case of a programmable mirror array, the support may be embodied as a frame or table, for example, which may be fixed or movable as required.

Another example of a patterning device is a programmable LCD array. An example of such a construction is given in U. S. Pat. No. 5,229,872. As above, the support in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the beam in a given reference direction (the "scanning" direction) while synchronously scanning the substrate table parallel or anti-parallel to this direction. Since, in general, the projection system will have a magnification factor M (generally<1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are described, for example, in U.S. Pat. Nos. 5,969,441 and 6,262,796.

In lithographic apparatus it is important to minimize the contaminant level, especially in the environment surrounding the substrate immediately after it has been exposed by the projection beam. This is because the resist which is coated onto the substrate may react with the contaminants, degrading the layer of resist. Sensitivity to these contaminants increases as the dimensions of the devices formed on the substrate decrease (due to the continual pressure to reduce the size of the devices). Sensitivity also increases as the resists themselves become more sensitive to enable lower exposure doses and consequently faster throughput of the apparatus.

SUMMARY OF THE INVENTION

It is an aspect of the present invention to reduce the exposure of the resist on the substrate to contaminants.

This and other aspects are achieved according to the invention in a lithographic apparatus including a radiation system configured to supply a beam of radiation, the beam of radiation being patterned by a patterning device; a substrate table configured to hold a substrate; a projection system configured to project the patterned beam onto a target portion of the substrate; a processing unit configured to process the substrate before and/or after it has been exposed by the beam; a transport unit configured to transport the substrate between the substrate table and the processing unit; and a contamination control device configured to control the partial pressure of $H_2O$ in the transport unit to be less than $1\times10^{-2}$ mbar, the partial pressure of hydrocarbons in the transport unit to be less than $1\times10^{-4}$ mbar and the partial pressure of amine bases, such as ammonia, in the transport unit to be less than $1-1^{-6}$ mbar.

This reduces the exposure of the resist on the substrate to contaminants during a significant portion of the time between the resist being exposed and the post exposure bake, after which the substrate is less sensitive to contaminants. The substrate may be contained in such a controlled environment for the entire time in which the resist on the substrate is in a reactive state, namely from application to the substrate until developing is complete.

Preferably, the partial pressure of all contaminants in the transport unit is less than 1 mbar. Furthermore, the partial pressure of $H_2O$ in the transport unit is preferably less than $1\times10^{-5}$ mbar, the partial pressure of hydrocarbons in the transport unit is less than $1\times10^{-7}$ mbar, and the partial pressure of amine bases in the transport unit is less than $1\times10^{-7}$ mbar.

The partial pressure of the $H_2O$ and other contaminants in the transport unit may be reduced by substantially evacuating the transport unit. This obviates the need for conditioning gases (for example, controlling the humidity level) or for providing filters to remove contaminants from the gases in the transport unit. In apparatus in which at least one of the chamber in which the substrate table is located and the processing unit is evacuated, this also significantly reduces the time required since time will not be lost raising or lowering the pressure as the substrate is transferred between the transport unit and another evacuated chamber. This may be the case, for example, where a dry development step is used. In this case both the exposure and the post exposure bake (PEB) are carried out at low pressure. Maintaining the transport unit also at a low pressure prevents time being lost raising and lowering the pressure of the atmosphere surrounding the substrate. Consequently the throughput of the apparatus is improved.

Alternatively, the partial pressure of $H_2O$ and other contaminants in the transport unit may be controlled by providing a substantially contaminant-free gas to the transport unit. Again this obviates the need for conditioning and filtering the gas in the transport unit. Examples of such a contaminant-free gas include substantially pure nitrogen and synthetic sir (a mixture of substantially pure nitrogen and substantially pure oxygen). This option for controlling the partial pressure of $H_2O$ in the transport unit is also advantageous since it is relatively simple to effect.

The present invention is especially suited to apparatus which uses EUV as the radiation for the projection beam since the resists used are very sensitive.

Preferably the processing unit at least one of applies a layer of resist to the substrate, bakes the substrate to fix the resist, cools the substrate after it has been baked, and develops the substrate with resist.

According to a further aspect of the invention there is provided a device manufacturing method including projecting a patterned beam of radiation onto a target portion of a layer of radiation-sensitive material at least partially covering a substrate; and transporting the substrate in a transport unit with a partial pressure of $H_2O$ in the transport unit less than $1\times10^{-2}$ mbar, a partial pressure of hydrocarbons in the transport unit less than $1-10^{-4}$ mbar, and a partial pressure of amine bases in the transport unit less than $1\times10^{-6}$ mbar.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill in the art will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g, with a wavelength of 365, 248, 193, 157 or 126 nm) and EUV (extreme ultra-violet radiation, e.g. having a wavelength in the range 5–20 nm), as well as particle beams, such as ion beams or electron beams.

BRIEF DESCRIPTION OF THE DRAWINGS

Embodiments of the present invention will now be described, by way of example only, with reference to the accompanying schematic drawings in which.

In the Figures, corresponding reference symbols indicate corresponding parts.

DETAILED DESCRIPTION

Figure 1:
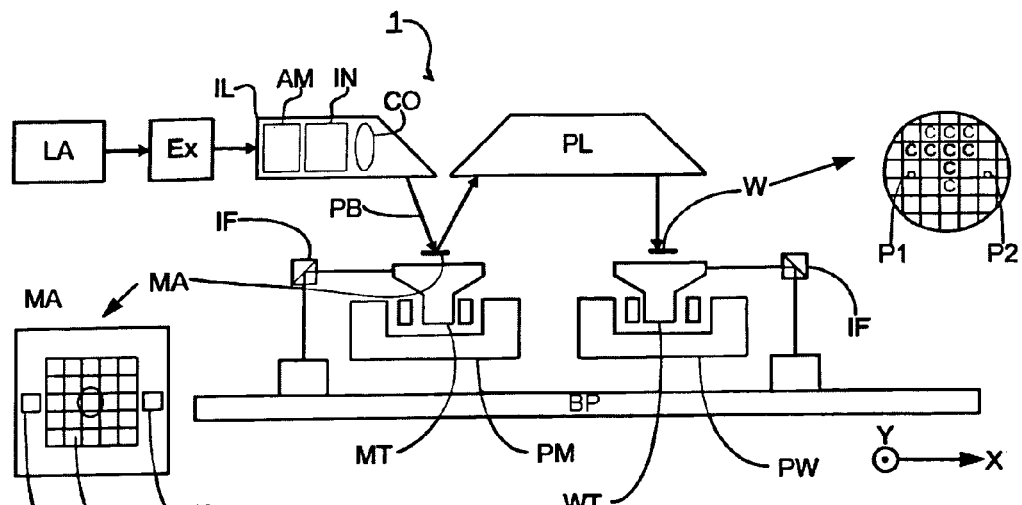
FIG. 1 depicts a lithographic projection apparatus according to an embodiment of the present invention.

FIG. 1 schematically depicts a lithographic projection apparatus 1 according to an embodiment of the invention. The apparatus 1 includes a base plate BP. The apparatus may also include a radiation source LA (e.g. UV or EUV radiation, such as, for example, generated by an excimer laser operating at a wavelength of 248 nm, 193 nm or 157 nm, or by a laser-fired plasma source operating at 13.6 nm). A first object (mask) table MT is provided with a mask holder configured to hold a mask MA (e.g. a reticle), and is connected to a first positioning device PM that accurately positions the mask with respect to a projection system or lens PL. A second object (substrate) table WT is provided with a substrate holder configured to hold a substrate W (e.g. a resist-coated silicon wafer), and is connected to a second positioning device PW that accurately positions the substrate with respect to the projection system PL. The projection system or lens PL (e.g. a mirror group) is configured to image an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example with a transmissive mask. Alternatively, the apparatus may employ another kind of patterning device, such as a programmable mirror array of a type as referred to above.

The source LA (e.g. a discharge or laser-produced plasma source) produces radiation. This radiation is fed into an illumination system (illuminator) IL, either directly or after having traversed a conditioning device, such as a beam expander Ex, for example. The illuminator IL may comprise an adjusting device AM configured to set the outer and/or inner radial extent (commonly referred to as σ-outer and σ-inner, respectively) of the intensity distribution in the beam PB. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus, as is often the case when the source LA is a mercury lamp, for example, but that it may also be remote from the lithographic projection apparatus, the radiation which it produces being led into the apparatus (e.g. with the aid of suitable directing mirrors). This latter scenario is often the case when the source LA is an excimer laser. The present invention encompasses both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW and interferometer(s) IF, the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;

2. In scan mode, essentially the same scenario applies, except that a given target portion C is not exposed in a single "flash." Instead, the mask table MT is movable in a given direction (the so-called "scan direction", e.g., the Y direction) with a speed v, so that the projection beam PB is caused to scan over a mask image. Concurrently, the substrate table WT is simultaneously moved in the same or opposite direction at a speed V = Mv, in which M is the magnification of the lens PL (typically, M = ¼ or ⅕). In this manner, a relatively large target portion C can be exposed, without having to compromise on resolution.

Figure 2:
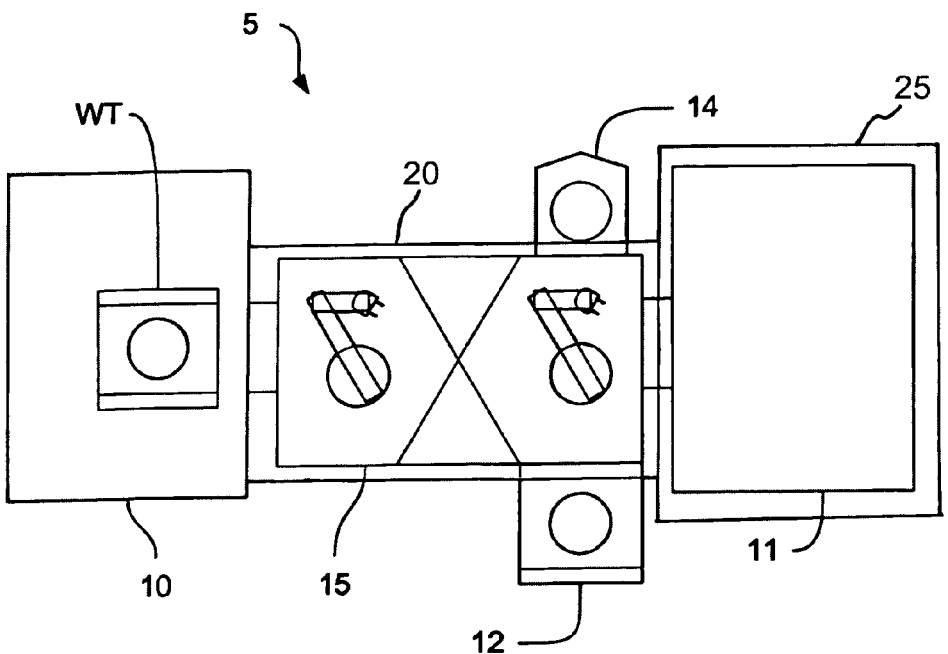
FIG. 2 depicts a transport unit according to the present invention.

FIG. 2 shows a transport unit 5 according to the present invention. The transport unit 5 is attached to a chamber 10 surrounding the substrate table WT and a processing unit 11. The processing unit 11 prepares a substrate W before it is placed on the substrate table WT to be exposed and to processes the resist after the substrate has been exposed. To this end, the processing unit 11 may apply a resist to the substrate, bake the substrate to fix the resist, cool the substrate to return it to ambient temperature after it has been baked, and developing the substrate to define the patterns. The transport unit 5 may also be attached to additional components. For example, as shown in FIG. 2, the transport unit 5 is connected to an integrated bake-chill unit 12 that is not part of the processing unit 11. Furthermore, it is attached to a loading station 14 loads substrates into the apparatus.

If the transport unit 5 is connected to the integrated bake-chill unit 12, the transport unit 5 can bake and chill the substrate after the exposure with radiation. As a consequence, these functions are no longer required in the processing unit 11.

The transport unit 5 is enclosed in a chamber 20, sealing it from the environment in which the lithographic apparatus is located (normally a clean room). Within the chamber 20, contaminants are substantially excluded. For instance, the partial pressure of $H_2O$ is below $1 \times 10^{-2}$ mbar, and preferably below $1 \times 10^{-5}$ mbar; the partial pressure of hydrocarbons is below $1 \times 10^{-4}$ mbar, and preferably below $1 \times 10^{-7}$ mbar; and the partial pressure of amine bases, such as ammonia, is below $1\times10^{-6}$ mbar, and preferably below $1\times10^{-7}$ mbar. The partial pressure of all contaminants combined is less than 1 mbar.

In order to provide the low contamination levels, the chamber 20 may be evacuated. This is especially useful if the lithographic apparatus uses EUV radiation as the projection beam since the chamber 10 containing the substrate table WT is evacuated during exposure. Therefore, were the transport unit to operate at atmospheric pressure, time would be lost evacuating the chamber 10 housing the substrate table WT after each substrate is loaded from the transport unit 5 to the substrate table WT.

Alternatively, the chamber 20 may be supplied with a substantially pure gas, such as $N_2$ or synthetic air (a mixture of substantially pure $N_2$ and substantially pure $O_2$). The pure gas is provided from a gas supply rather than filtering gas from the environment since to provide filters of a sufficiently high standard would be costly. Such filters would also be bulky. The pure gas displaces any gas from the environment within the chamber housing the transport unit 5, removing any contaminants. The pure gas in the chamber 20 may be maintained at a pressure that is slightly higher than that of the ambient environment to ensure that any gas flow through apertures and leaks in the chamber 20 flow into the ambient environment, rather than from the ambient environment into the chamber 20.

The processing unit 11 may also be contained in a chamber 25 with similar conditions to the chamber 20 (substantially evacuated or filled with substantially pure gas, for example). This reduces the risk of faults caused by contaminants in the processing unit 11 while the resist is sensitive, namely immediately prior to the post-exposure bake, during the post-exposure bake and during the subsequent chilling process until the substrate has reached ambient temperature. Furthermore, by maintaining the processing unit 11 at the same conditions as the transport unit 5, no time is lost in transferring the substrate between the processing unit 11 and the transport unit 5. For example, neither unit will need to be pumped down to a substantially evacuated state immediately before or immediately after such a transfer.

As depicted in FIG. 2, the transport unit 5 may include a plurality of substrate handling robots 15 that transfer the substrates between the different sections of the transport unit 5 and the chamber 10, the processing unit 11, bake-chill unit 12, and/or the loading station 14 attached to the transport unit 5. It will be appreciated, however, that, depending on the circumstance, the transport unit 5 may include a single wafer handling robot 15 or may include some other transport apparatus, for example a conveyor belt.

While specific embodiments of the invention have been described above, it will be appreciated that the invention may be practiced otherwise than as described. The description is not intended to limit the invention.

What is claimed is:

1. A lithographic projection apparatus, comprising:
    a radiation system configured to provide a beam of radiation, the beam being patterned by a patterning device;
    a substrate table configure to hold a substrate;
    a projection system configured to project the patterned beam onto a target portion of the substrate;
    a processing unit configured to process the substrate at least one of before and after the substrate has been exposed to the beam of radiation;
    a transport unit configured to transport the substrate between the substrate table and the processing unit; and
    a contamination control device configured to control the partial pressure of $H_2O$ in the transport unit to be less than $1\times10^{-2}$ mbar, the partial pressure of hydrocarbons in the transport unit to be less than $1\times10^{-4}$ mbar, and the partial pressure of amine bases in the transport unit to be less than $1\times10^{-6}$ mbar.

2. A lithographic projection apparatus according to claim 1, wherein the contamination control device is configured to control the partial pressure of contaminants in the transport unit to be less than 1 mbar.

3. A lithographic projection apparatus according to claim 1, wherein contamination control device is configured to control the partial pressure of $H_2O$ in the transport unit to be less than $1\times10^{-5}$ mbar, the partial pressure of hydrocarbons in the transport unit to be less than $1\times10^{-7}$ mbar, and the partial pressure of amine bases in the transport unit to be less than $1\times10^{-7}$ mbar.

4. A lithographic projection apparatus according to claim 1, wherein the contamination control device substantially evacuates the transport unit.

5. A lithographic projection apparatus according to claim 4, wherein at least one of a space surrounding the substrate table and a space surrounding the processing unit is substantially evacuated.

6. A lithographic projection apparatus according to claim 1, wherein the contamination control device comprises a gas supply configured to supply a substantially contaminant-free gas to fill the transport unit.

7. A lithographic projection apparatus according to claim 6, wherein the substantially contaminant-free gas is one of substantially pure nitrogen and synthetic air.

8. A lithographic projection apparatus according to claim 1, wherein the beam of radiation is EUV radiation.

9. A lithographic projection apparatus according to claim 1, wherein the processing unit is configured to at least one of:
    apply a layer of resist to the substrate;
    bake the substrate to process the resist;
    cool the substrate after it has been baked; and
    develop the substrate with the resist.

10. A lithographic projection apparatus according to claim 1, wherein the transport unit is configured to at least one of:
    bake the substrate to process the resist; and
    cool the substrate after it has been baked.

11. A device manufacturing method, comprising:
    projecting a patterned beam of radiation onto a target portion of a layer of radiation-sensitive material at least partially covering a substrate; and
    transporting the substrate in a transport unit between a substrate table and a processing unit configured to process the substrate at least one of before and after it has been exposed by the patterned beam of radiation, wherein a partial pressure of $H_2O$ in the transport unit is less than $1\times10^{-2}$ mbar, a partial pressure of hydrocarbons in the transport unit is less than $1\times10^{-4}$ mbar, and a partial pressure of amine bases in the transport unit is less than $1\times10^{-6}$ mbar.

12. A device manufacturing method according to claim 11, wherein a partial pressure of contaminants in the transport unit is less than 1 mbar.

13. A device manufacturing method according to claim 11, the partial pressure of $H_2O$ in the transport unit is less than $1\times10^{-5}$ mbar, the partial pressure of hydrocarbons in the transport unit is less than $1\times10^{-7}$ mbar, and the partial pressure of amine bases in the transport unit is less than $1\times10^{-7}$ mbar.

14. A device manufacturing method according to claim 11, further comprising substantially evacuating the transport unit.

15. A device manufacturing method according to claim 11, further comprising filling the transport unit with a substantially contaminant-free gas.

16. A device manufacturing method according to claim 15, wherein the substantially contaminant-free gas is one of substantially pure nitrogen and synthetic air.

17. A device manufacturing method according to claim 11, further comprising at least one of:
    applying a layer of resist to the substrate;
    baking the substrate to process the resist;
    cooling the substrate after it has been baked; and
    developing the substrate with the resist.

18. A device manufacturing method according to claim 11, wherein the beam of radiation is EUV radiation.

19. A device manufactured by the method of claim 11.

20. A transport unit configured to transport a substrate between a lithographic projection apparatus and a processing unit, wherein the transport unit comprises a contamination control device configured to control the partial pressure of $H_2O$ in the transport unit to be less than $1\times10^{-2}$ mbar, the partial pressure of hydrocarbons in the transport unit to be less than $1\times10^{-4}$ mbar, and the partial pressure of amine bases in the transport unit to be less than $1\times10^{-6}$ mbar.

21. A transport unit according to claim 20, wherein the contamination control device is configured to control the partial pressure of contaminants in the transport unit to be less than 1 mbar.

22. A transport unit according to claim 20, wherein contamination control device is configured to control the partial pressure of $H_2O$ in the transport unit to be less than $1\times10^{-5}$ mbar, the partial pressure of hydrocarbons in the transport unit to be less than $1\times10^{-7}$ mbar, and the partial pressure of amine bases in the transport unit to be less than $1\times10^{-7}$ mbar.

23. A transport unit according to claim 20, wherein the contamination control device substantially evacuates the transport unit.

24. A transport unit according to claim 20, wherein the contamination control device comprises a gas supply configured to supply a substantially contaminant-free gas to fill the transport unit.

25. A transport unit according to claim 24, wherein the substantially contaminant-free gas is one of substantially pure nitrogen and synthetic air.

* * * * *